United States Patent [19]

Tusques

[11] Patent Number: 5,210,378
[45] Date of Patent: May 11, 1993

[54] JOINT ASSEMBLY FOR POWER AND SIGNAL COUPLING BETWEEN RELATIVELY ROTATABLE STRUCTURES

[75] Inventor: Alain Tusques, Alta Loma, Calif.

[73] Assignee: Schaeffer Magnetics, Inc., Chatsworth, Calif.

[21] Appl. No.: 737,784

[22] Filed: Jul. 30, 1991

[51] Int. Cl.$^5$ ............................................... H01B 7/08
[52] U.S. Cl. ............................ 174/117 F; 174/75 R; 174/47; 174/117 FF; 174/268; 361/215; 361/398; 385/114
[58] Field of Search ............. 174/117 F, 117 FF, 268, 174/75 R, 75 F, 47, 86; 361/215, 398; 385/114

[56] References Cited

U.S. PATENT DOCUMENTS

| | | | |
|---|---|---|---|
| 243,180 | 6/1881 | Ware | 174/117 F X |
| 2,774,382 | 12/1956 | Bentley | 174/47 X |
| 3,818,122 | 6/1974 | Luetzow | 174/86 |
| 3,979,763 | 9/1976 | Mills | 174/86 X |
| 4,146,302 | 3/1979 | Jachimowicz | 385/114 |
| 4,542,858 | 9/1985 | Manges | 191/12.2 R |
| 4,587,719 | 5/1986 | Barth | 361/398 |
| 4,939,514 | 7/1990 | Miyazaki | 361/398 |

FOREIGN PATENT DOCUMENTS 1041127 10/1958 Fed. Rep. of Germany ........ 174/69

*Primary Examiner*—Morris H. Nimmo
*Attorney, Agent, or Firm*—Blakely, Sokoloff, Taylor & Zafman

[57] ABSTRACT

A joint assembly for allowing relative rotational movement of two structures. The joint assembly has a flexible member with a first surface facing a first direction and second surface facing a second opposite direction. The flexible member is typically a flexible circuit board or an electrical wire cable, that extends from a first structure to a second structure. The structures are interconnected so that they can rotate relative to each other. The flexible member is constructed in an essentially radial shape that defines an arcuate path. One end of the flexible member is attached to the first structure and the other opposite end is connected to the second structure. When the second structure rotates relative to the first structure, the end of the flexible member attached to the second structure moves along the arcuate path. As the flexible member moves along the arcuate path the member rolls over itself. That is, the portion of the flexible member that is rolled over, has its second surface facing the first direction instead of the second opposite direction.

24 Claims, 1 Drawing Sheet

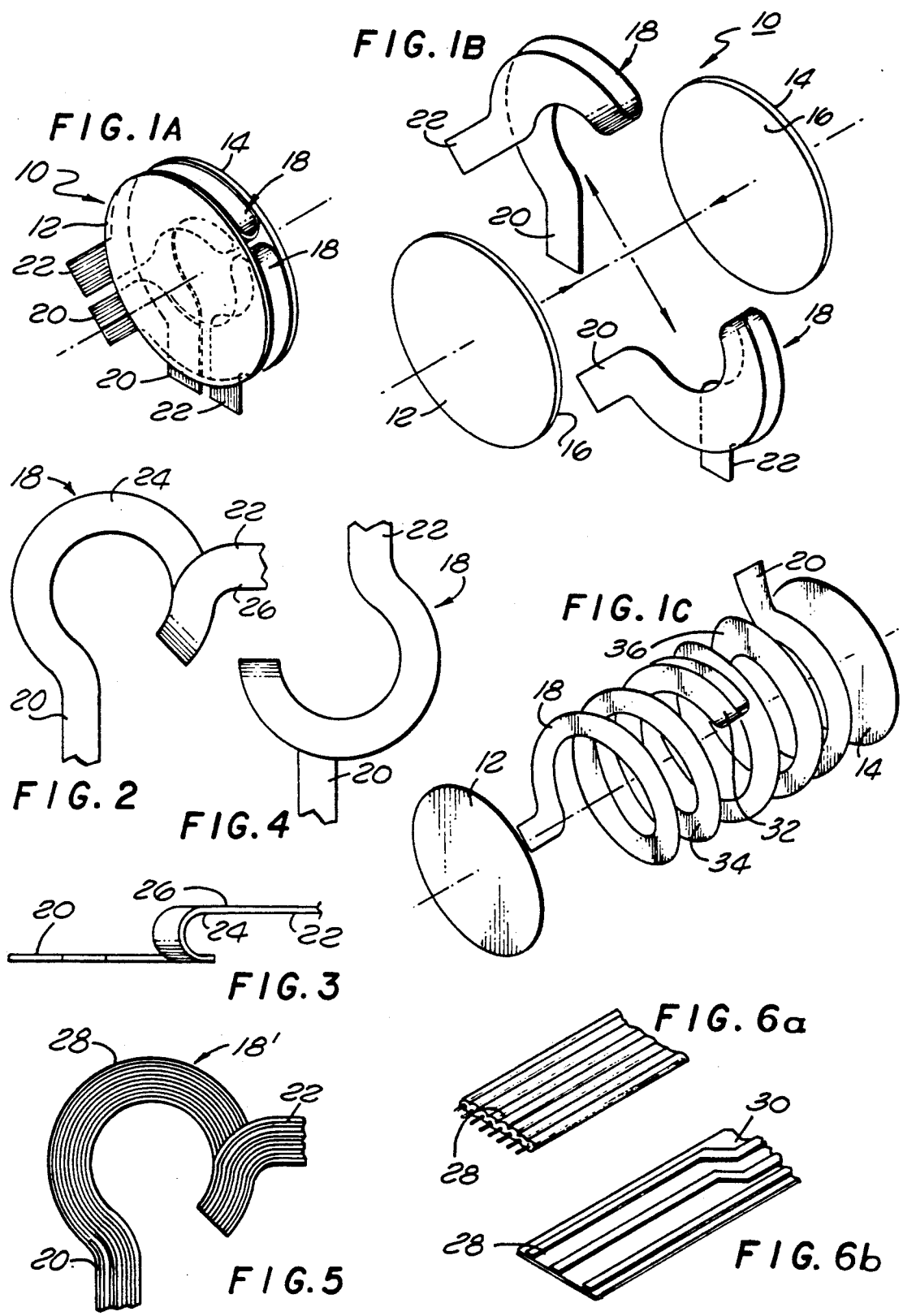

JOINT ASSEMBLY FOR POWER AND SIGNAL COUPLING BETWEEN RELATIVELY ROTATABLE STRUCTURES

BACKGROUND OF THE INVENTION

1. Field of Invention

The present invention is a cable with a predetermined shape that allows two members to rotate relative to each other.

2. Description of Related Art

Robots typically have at least one degree of freedom that allows relative rotational movement between two rigid structures. The structure that is in motion usually has an actuator or electric motor at one end to grasp, weld or perform other types of functions. The actuator or motor is connected by wires to a source of electric power. The wire is usually attached to the robot such that it must pass through a joint between the two structures. To allow the wire to move with the rotating structure, the wire is provided with additional length or slack, so that the wire can extend when the rotating structure is rotated into its maximum extension. The extra wire length dangles about and is susceptible to entanglement with the rotating structure. Because the wire typically extends through the joint, the wire can also become pinched and severed by the rotation of the structure. Rotating electrical couplings such as slip rings can be used, but these are subject to wear and contamination and can create an undesirable amount of electrical resistance in the line, particularly when power or signals must pass over multiple joints in series.

Therefore what is needed is a wire configuration that allows relative rotational movement between two structures without having to provide excess wire length that can become entangled, pinched, or produce an excessive amount of electrical resistance.

SUMMARY OF THE INVENTION

The present invention is a joint assembly for allowing relative rotational movement of two structures. The joint assembly has a flexible member with a first surface facing a first direction and second surface facing a second opposite direction. The flexible member is typically a flexible circuit board or an electrical wire cable, that extends from a first structure to a second structure. The structures are interconnected so that they can rotate relative to each other. The flexible member is constructed in an essentially radial shape that defines an arcuate path. One end of the flexible member is attached to the first structure and the other opposite end is connected to the second structure.

When the second structure rotates relative to the first structure, the end of the flexible member attached to the second structure moves along the arcuate path. As the flexible member moves along the arcuate path the member rolls over itself. That is, the portion of the flexible member that is rolled over, has its second surface facing the first direction instead of the second direction. The flexible member is preferably constructed with a plurality of electrical lines or wires, wherein all the wires move in an orderly pattern without entanglement.

Therefore it is an object of this invention to provide an electrical cable connected to two structures, that allows the structures to rotate relative to each other without causing entanglement or pinching of the cable.

BRIEF DESCRIPTION OF THE DRAWINGS

The objects and advantages of the present invention will become more readily apparent to those skilled in the art after reviewing the following detailed description and accompanying drawings, wherein:

FIG. 1A is a perspective view of a joint assembly of the present invention, showing two flexible members between two structures that can rotate relative to each other;

FIG. 1B is an exploded perspective view of FIG. 1 showing the folded arrangement of the two flexible members;

FIG. 1C is an exploded perspective view of an alternate embodiment of the joint assembly of FIG. 1;

FIG. 2 is a top view of one of the flexible members of FIG. 1;

FIG. 3 is a side view of FIG. 2, showing how the cable rolls over itself;

FIG. 4 is the joint cable of FIG. 3, wherein one structure has rotated approximately 450 degrees relative to the other structure;

FIG. 5 is a joint cable similar to FIG. 3, showing a pattern of electrical conductors that extend through the cable joint;

FIG. 6a shows a cable comprising a plurality of wires each encapsulated by a layer of insulative material in a cable ribbon;

FIG. 6b shows a cable constructed from two electrically insulative sheets encapsulating a plurality of printed electrical conductors.

DETAILED DESCRIPTION OF THE INVENTION

Referring to the drawings more particularly by reference numbers, FIGS. 1A and 1B show a preferred embodiment of the joint assembly 10 of the present invention. The assembly 10 has a first rigid structure 12 and a second rigid structure 14 each having a first surface 16 and adapted to rotate relative to each other as indicated by the arrows. The assembly 10 has two arcuate shaped flexible members 18 between the first 12 and second 14 structures. The flexible members 18 have ends 20 and 22, that are fixed relative to the structures. The members 18 are in a folded arrangement as shown in FIG. 1B.

The assembly 10 can be, by way of example, a robotic arm, wherein the first structure 12 is attached to a base and the second structure 14 is rotated about a rotary actuator relative to the first structure 12. The flexible member 18 is typically a wire cable to provide electrical signals and/or power to an electrical actuator located at the end of the second structure 14. Although two flexible members 18 are shown, it is to be understood that the joint assembly may have only one flexible member 18 connected to both structures. It is preferable to use two flexible members 18, to increase the wiring density of the cable. The flexible member 16 could also be a hose adapted to allow a fluid medium such as pressurized air or hydraulic fluid, to be supplied from a fluid source to an actuator located at the end of the second structure 14. It being understood that the flexible member of the disclosed configuration can be used for any conduit that extends between two structures that rotate relative to each other.

FIG. 2 shows a top view of one of the flexible members of the present invention. The first end 20 of the member 18 is attached to one structure and the second end 22 is attached to another structure 14. A first surface 24 of the flexible member 18 faces a first direction and a second opposite surface 26 of the member 18 faces a second opposite direction. The flexible member 18 is preferably constructed in a circular shape with a center preferably coinciding with the center of relative rotation between the two structures. Although a circular shape is shown, it is to be understood that any shape can be used including an arc portion of a circle. FIGS. 3 and 4 show the movement of the flexible member 16 as the second end 22 and attached structure is rotated in a counterclockwise direction relative to the first end 20. As the second end 22 is rotating, the flexible member 16 rolls onto itself such that the first surface 24 is facing the second direction. The portion of the flexible member 18 having the second surface 26 facing the first direction is approximately one-half the radial distance rotated by end 22, wherein the member 18 is being continuously folded in-half. The second end 22 and adjoining structure can therefore rotate greater than 360 degrees, because the actual displacement of the member 18 is one-half the radial movement of the second end 22. Theoretically a circular member having 360 degrees of displacement can allow 720 degrees of rotation. In practice the actual amount of rotation is limited by the width of the flexible member 16 and the space between the structures, and is typically in the range of 680 degrees. Referring again to FIG. 1A, it can be seen that two flexible members 18 can be attached as mirror images of each other. Such an arrangement allows both flexible members 18 to roll onto themselves without interfering with each other when the structures are rotated.

As shown in FIG. 1C, the joint assembly 10 may have a single flexible member 18 that has a folded portion 32. The member 18 has a number of first turns 34 between the folded portion 32 and the end 20 that spiral in a first direction, and a number of second turns 36 between the folded portion 32 and the end 22 that spiral in a second opposite direction. As the ends 20 and 22 are rotated relative to each, the member 18 rolls onto itself, wherein the folded portion 32 will move toward one of the structures 12 or 14. For example, if the end 22 is rotated in a counterclockwise direction, the member 18 will turn and the folded portion 32 will move toward structure 14. The end 22 can be rotated until the folded portion 32 reaches end 20. For every turn in the member 18, the ends and attached structures can rotate 720 degrees relative to each other. Thus for a member 18 with two first 34 and two second 36 turns, the structures can be rotated at least 1420 degrees in either direction.

The flexible member can be a flexible printed circuit 18' that has a plurality of electrical conductors 28 that extend through the member as shown in FIG. 5. The conductors 28 can provide electrical signals or power to an electrical device located on the second structure 14. The circuit can be a flexible printed board known in the art as a flex-circuit, which comprises two electrically insulative sheets 30 that encapsulate copper conductors 28 that are etched in a predetermined pattern, as shown in FIG. 6b. The conductors 28 are preferably quite thin, to reduce the amount of stress induced into the copper when the flex-circuit is bent as shown in FIG. 3. In the alternative, the flexible member can be a plurality of conductive wires each encapsulated by a layer of insulation and attached to each other as shown in FIG. 6a, or a bundle of optic fibers that transmit light. In addition, the flexible member could be a hollow hose or tube, that allows either pressurized air or hydraulic fluid to flow therethrough. In fact any flexible member that extends through two structures that rotate relative to each other can be used. The joint assembly of this invention provides excess wire length in a compact arrangement such that the length of the wire between the two ends 20 and 22 are always the same. With such a configuration there is no lagging portions of the wire that can become entangled or pinched by the structure.

While certain exemplary embodiments have been described in detail and shown in the accompanying drawings, it is to be understood that such embodiments are merely illustrative of, and not restrictive on the broad invention, and that the invention is not to be limited to the specific constructions and arrangements shown and described, since various other modifications may occur to those skilled in the art.

What is claimed is:

1. A joint assembly for allowing relative rotational movement between two structures, comprising:
   a first structure;
   a first flexible transmitting member having a first surface facing a first direction and second surface facing a second opposite direction, said first flexible transmitting member being constructed in a predefined shape defining a predefined path, said first flexible transmitting member having a first end operatively connected to said first structure and a second end adapted to move in approximately said predefined path such that said first surface of a portion of said first flexible transmitting member faces said second direction; and,
   a second structure operatively connected to said second end of said first flexible transmitting member adapted to rotate relative to said first structure such that said second end rotates in said predefined path.

2. The assembly as recited in claim 1, wherein said predefined shape is an arc defining an arcuate path.

3. The assembly as recited in claim 1, wherein said predefined shape is a circle defining a circular path.

4. The assembly as recited in claim 3, wherein said second structure rotates up to 680 degrees relative to said first structure.

5. The assembly as recited in claim 3, wherein said first flexible transmitting member has a folded portion and at least one turn between said first end and said folded portion, wherein said second structure can rotate greater than 720 degrees relative to said first structure.

6. The assembly as recited in claim 5, wherein said first flexible transmitting member has at least one turn between said folded portion and said second end.

7. The assembly as recited in claim 1, further comprising a second flexible transmitting member having a first surface facing a first direction and second surface facing a second opposite direction, said second flexible transmitting member being constructed in a predefined shape defining a predefined path, said second flexible transmitting member having a first end operatively connected to said first structure and a second end adapted to move in approximately said predefined path such that said first surface of a portion of said second flexible transmitting member faces said second direction.

8. The assembly as recited in claim 4, wherein said first and second flexible transmitting members each have a plurality of electrical conductors extending from said first structure to said second structure along said predefined path, said electrical conductors being encapsulated by at least two flexible sheets constructed from electrically insulative material, whereby said electrical conductors and said flexible sheets form first and second flexible circuit boards.

9. The assembly as recited in claim 1, wherein said first flexible transmitting member includes at least one tube that allows fluid to flow therethrough.

10. The assembly as recited in claim 1, wherein said first flexible transmitting member includes at least one optic fiber.

11. The assembly as recited in claim 9, wherein said first flexible transmitting member includes at least one optic fiber.

12. A joint assembly for allowing rotational movement between two structures, comprising:
a first structure;
a flexible circuit board having a plurality of electrical conductors extending through said flexible circuit board in a predetermined pattern, said flexible circuit board having a first surface facing a first direction and a second surface facing a second opposite direction, said flexible circuit board being constructed in an essentially circular shape defining a circular path, said flexible circuit board having a first end operatively connected to said first structure and a second end adapted to move in approximately said circular path such that said first surface of a portion of said flexible circuit board faces said second direction; and,
a second structure operatively connected to said second end of said flexible circuit board adapted to rotate relative to said first structure such that said second end of said flexible member moves in said circular path.

13. The assembly as recited in claim 12, further comprising a second flexible circuit board having a first surface facing a first direction and second surface facing a second opposite direction, said second flexible circuit board being constructed in an essentially circular shape defining a circular path, said second flexible circuit board having a fist end operatively connected to said first structure and a second end adapted to move in approximately said circular path such that said first surface of a portion of said second flexible circuit board faces said second direction.

14. The assembly as recited in claim 13, wherein said second structure rotates up to 680 degrees relative to said first structure.

15. A joint assembly for allowing relative rotational movement between two structures, comprising:
a first structure having a first surface;
a second structure having a second surface facing said first surface of said first structure, said first and second structures being adapted to rotate relative to each other;
a first flexible transmitting member having a first surface facing a first direction and second surface facing a second opposite direction, said first flexible transmitting member being constructed in a first predefined shape defining a first predefined path, said first flexible transmitting member having a first end operatively connected to said first surface of said first structure, and a second end attached to said second surface of said second structure adapted to move in approximately said first predefined path such that said first surface of a portion of said first flexible transmitting member faces said second direction; and,
a second flexible transmitting member having a first surface facing said second direction and a second surface facing said first direction, said second flexible transmitting member being constructed in a predefined shape defining a predefined path, said second flexible transmitting member having a first end operatively connected to said second surface of said second structure, and a second end attached to said first surface of said first structure adapted to move in approximately said predefined path such that said second surface of a portion of said flexible transmitting member faces said second direction;
whereby when said first and second structures rotate relative to each other said first and second flexible transmitting members move in said predefined paths.

16. The assembly as recited in claim 15, wherein said first and second predefined shapes are an arc that defines an arcuate path.

17. The assembly as recited in claim 15, wherein said first and second predefined shapes are a circle that defines a circular path.

18. The assembly as recited in claim 15, wherein said structures rotate up to 680 degrees relative to said first structure.

19. The assembly as recited in claim 15, wherein said first and second flexible transmitting members each have a folded portion and at least one turn between said folded portion and said first end, such that said structures can rotate greater than 720 degrees relative to each other.

20. The assembly as recited in claim 19, wherein said first and second flexible transmitting members each have at least one turn between said folded portion and said second end.

21. The assembly as recited in claim 10, wherein said first and second flexible transmitting members each have a plurality of electrical conductors extending from said first structure to said second structure along said predefined path, said electrical conductors being encapsulated by at least two flexible sheets constructed from electrically insulative material, whereby said electrical conductors and said flexible sheets form first and second flexible circuit boards.

22. The assembly as recited in claim 15, wherein said first and second flexible transmitting members each include at least one tube that allows fluid to flow therethrough.

23. The assembly as recited in claim 15, wherein said first and second flexible transmitting members each include at least one optic fiber.

24. The assembly as recited in claim 22, wherein said first and second flexible transmitting members each include at least one optic fiber.

* * * * *